United States Patent [19]
Zuin

[11] Patent Number: 5,749,737
[45] Date of Patent: May 12, 1998

[54] MOTOR MOUNTING BRACKET FOR PCB

[75] Inventor: Gianni Zuin, Mestrino-Padova, Italy

[73] Assignee: Molex Incorporated, Lisle, Ill.

[21] Appl. No.: 677,437

[22] Filed: Jul. 2, 1996

[51] Int. Cl.[6] .................................................. H01R 3/00
[52] U.S. Cl. .................................. 439/500; 439/890
[58] Field of Search .......................... 439/500, 56, 890, 439/698

[56] References Cited

U.S. PATENT DOCUMENTS

| | | |
|---|---|---|
| 3,686,618 | 8/1972 | Gales . |
| 3,881,961 | 5/1975 | Nation ................................ 439/500 |
| 4,364,625 | 12/1982 | Baker et al. . |
| 4,565,415 | 1/1986 | Feinberg . |
| 4,778,408 | 10/1988 | Morrison ............................ 439/522 |
| 5,211,579 | 5/1993 | Seong et al. ....................... 439/500 |
| 5,395,263 | 3/1995 | Sandell .............................. 439/500 |
| 5,431,575 | 7/1995 | Engira ............................... 439/218 |
| 5,586,907 | 12/1996 | Frantz et al. ...................... 439/500 |

Primary Examiner—Hien Vu
Attorney, Agent, or Firm—Stacey E. Caldwell

[57] ABSTRACT

A bracket is provided for mounting a motor on a printed circuit board, with the motor including a pair of terminals. A dielectric housing mounts a pair of conductive contacts. Each contact includes a contact portion adapted for engaging a respective one of the motor terminals and a tail portion adapted for connection to an appropriate circuit trace on the printed circuit board. A receptacle receives the motor in position with the motor terminals in engagement with the contact portions of the contacts. The receptacle is formed in part by a portion of the dielectric housing and in part by a portion of at least one of the conductive contacts.

6 Claims, 3 Drawing Sheets

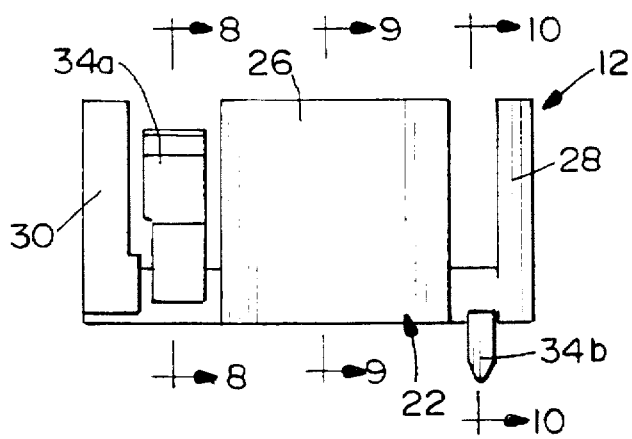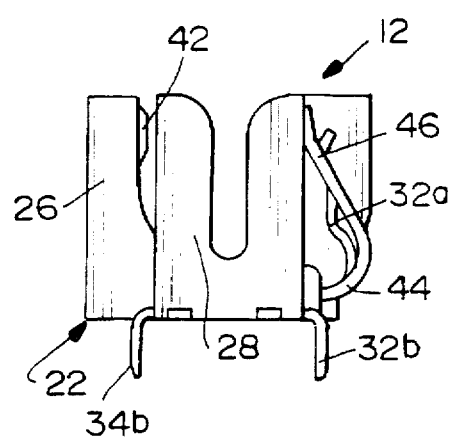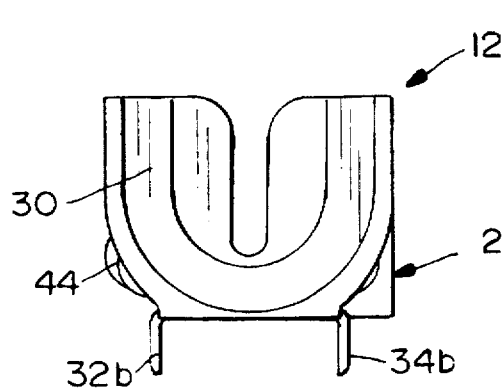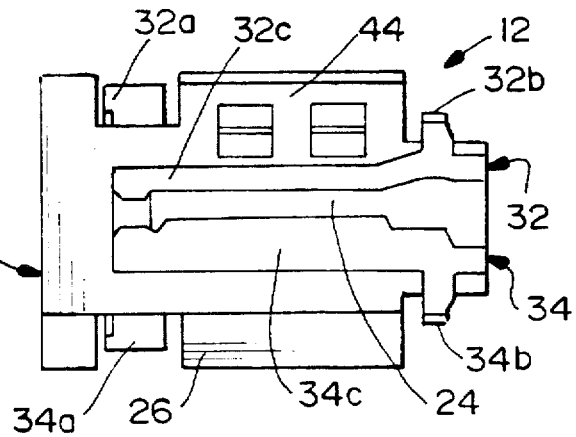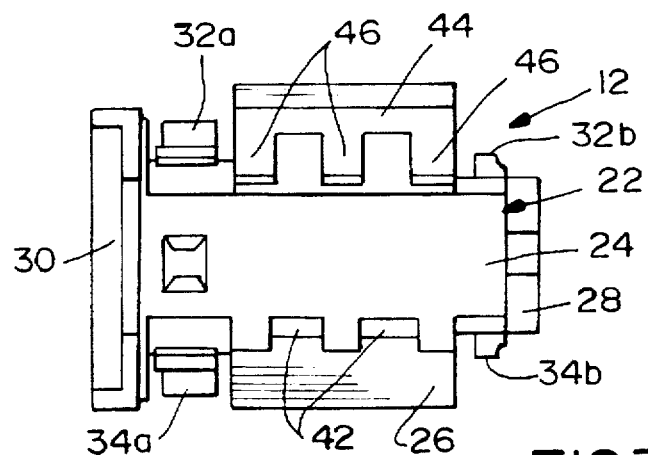

5,749,737

MOTOR MOUNTING BRACKET FOR PCB

FIELD OF THE INVENTION

This invention generally relates to electrical appliances and, particularly, to a bracket for mounting a motor on a printed circuit board.

BACKGROUND OF THE INVENTION

Various mounting means such as brackets or other appliances are used to mount various electrical or electronic devices on the surface of a printed circuit board. Some of the mounting means not only perform the mechanical function of mounting the device to the board, but electrical connections are provided for interconnecting the device to appropriate circuit traces on the board.

One such mounting means is a motor-mount bracket for mounting a small motor on a printed circuit board and interconnecting leads or terminals of the motor to appropriate circuit traces on the board. Typically, motor-mount brackets include a dielectric housing such as of molded plastic or the like. The housing includes a receptacle for mounting the motor. Contacts are provided on the housing for interconnecting the motor terminals to the circuit traces on the board.

Motor-mount brackets of the character described above are used in a wide variety of applications. In some applications, the assembly may be subjected to considerable physical abuse. One such application is in a pager wherein a vibrator motor typically is mounted on a printed circuit board. The pager must withstand considerable physical abuse such as drop tests or other specified parameters. Consequently, the dielectric housing must be quite robust to maintain the motor in its receptacle. This causes problems not only in the dielectric housing taking up too much "real estate" on the printed circuit board, but the base of the housing must be relatively thick and, thereby, presents a relatively high profile for the overall bracket structure.

The present invention is directed to solving the above problems by providing a unique motor-mount bracket which forms a receptacle means in part by the dielectric housing and in part by the contacts on the housing.

SUMMARY OF THE INVENTION

An object, therefore, of the invention is to provide a new and improved bracket for mounting a motor on a printed circuit board. As disclosed herein, but not intended to be limiting, the motor includes a pair of terminals.

In the exemplary embodiment of the invention, the bracket includes a dielectric housing having conductive contact means mounted thereon. With the motor including a pair of terminals, the contact means include a pair of conductive contacts mounted on the housing. Each contact includes a contact portion adapted for engaging a respective one of the motor terminals and a tail portion adapted for connection to an appropriate circuit trace on the printed circuit board. Receptacle means are provided for receiving the motor in position with the motor terminals in engagement with the contact portions of the contacts. The invention contemplates that the receptacle means be formed in part by a portion of the dielectric housing and in part by a portion of at least one of the conductive contacts.

As disclosed herein, the receptacle portion of the dielectric housing is provided by a gripping arm for embracing one side of the motor. The receptacle portion of the one conductive contact is provided by a spring arm for embracing an opposite side of the motor. The one conductive contact includes a body portion with the contact portion and the tail portion located at opposite ends thereof. The spring arm projects from the body portion intermediate its opposite ends.

Preferably, each of the contacts is a one-piece structure stamped and formed of sheet metal material. Lastly, the dielectric housing includes a shroud portion adapted for protecting a rotating shaft end of the motor.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 3 is a side elevational view of the bracket;

FIG. 4 is an end elevational view of the bracket, looking toward the left-hand end of FIG. 3;

FIG. 5 is an end elevational view of the bracket, looking toward the right-hand end of FIG. 3;

FIG. 6 is a bottom plan view of the bracket;

FIG. 7 is a top plan view of the bracket;

DETAILED DESCRIPTION OF THE PREFERRED EMBODIMENT

Figure 1:
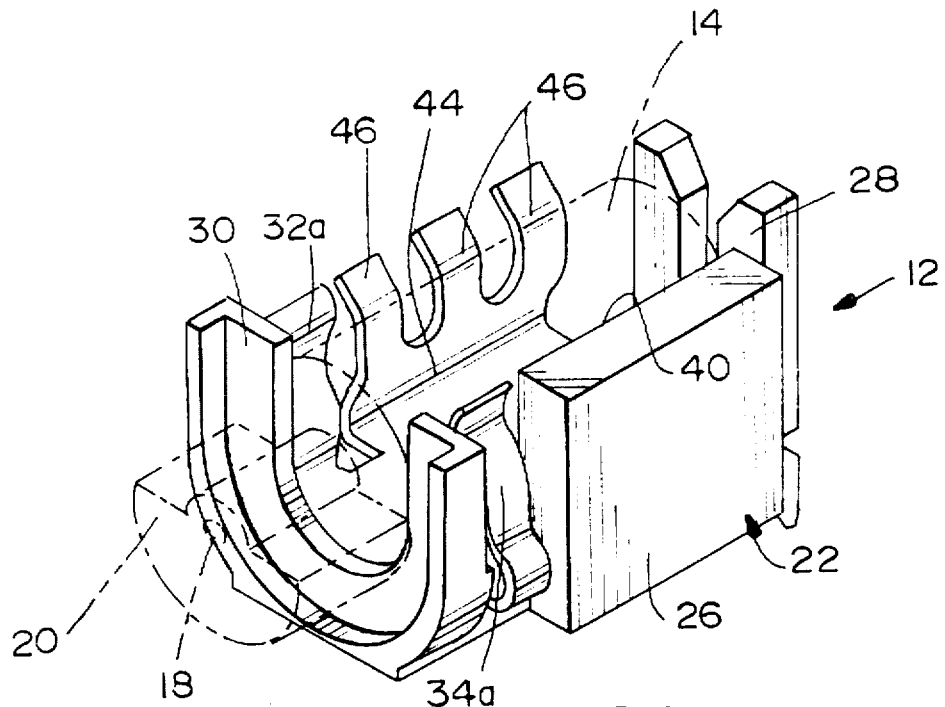
FIG. 1 is a top perspective view of the motor-mount bracket of the invention, with the motor shown in phantom.
Figure 2:
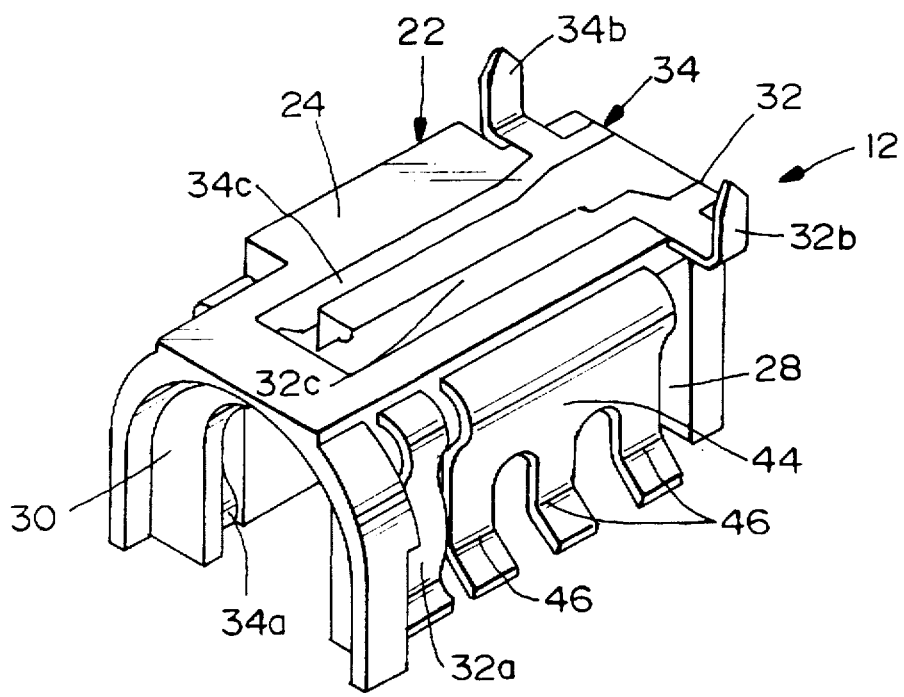
FIG. 2 is a bottom perspective view of the bracket.
Figure 8:
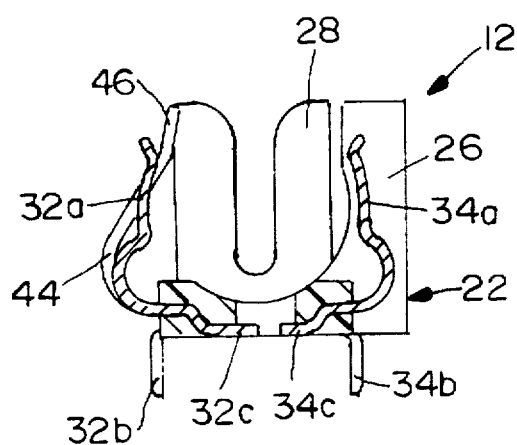
FIG. 8 is a vertical section taken generally along line 8—8 of FIG. 3.

Referring to the drawings in greater detail, and first to FIGS. 1 and 2, the invention is embodied in a bracket, generally designated 12, for mounting a motor (shown in phantom at 14) on a printed circuit board (not shown). Suffice it to say, motor 14 includes a pair of terminals on opposite diametral sides thereof. The motor is of the vibrator type which is used in pager assemblies or the like. The motor is elongated and includes a rotating shaft 18 projecting from one end thereof and mounting a counterweight 20 at the distal end of the shaft.

Motor-mount bracket 12 includes an elongated dielectric housing, generally designated 22, which is a one-piece structure unitarily molded of dielectric material such as plastic or the like. The housing is elongated and includes a bottom or base portion 24, upstanding side wall portions 26, a rear end wall portion 28 and a front end wall portion 30. The front end wall portion is formed in the shape of a shroud for protecting the rotating shaft end of motor 14.

Motor-mount bracket 12 also includes a pair of conductive contacts, generally designated 32 and 34. The contacts are stamped and formed of sheet metal material. Contact 32 has a contact portion 32a, and contact 34 has a contact portion 34a. The contact portions 32a and 34a are located for engaging the terminals on opposite sides of motor 14.

Contact 32 has a tail portion 32b, and contact 34 has a tail portion 34b. The tail portions 32b and 34b project below base portion 24 of housing 22 for insertion into appropriate holes in the printed circuit board for solder connection to circuit traces on the board and/or in the holes. Both of the contacts are elongated in the direction of the elongated housing and the elongated motor, and both contacts include elongated body portions 32c and 34c embedded within base portion 24 of the housing, as by an insert molding process. In other words, contact portions 32a and 34a of contacts 32 and 34, respectively, are located near the front of housing 22 at the front end of body portions 32c and 34c of the contacts, whereas tail portions 32a and 34b of the contacts are located at the rear ends of body portions 32c and 34c, respectively, near the rear end of housing 22. The contact portions are located inside front end wall portion or shroud 32 of the housing.

The invention contemplates the provision of a receptacle means 40 for receiving motor 14 in position with the motor terminals in engagement with contact portions 32a and 34a of contacts 32 and 34, respectively. Generally, the receptacle means is formed in part by a portion of dielectric housing 22 and in part by a portion of at least one of the conductive contacts, namely conductive contact 32. In essence, the receptacle combines the plastic of the housing and the metal of the contact in a composite robust structure to wrap or embrace the motor in a reduced space.

Figure 9:
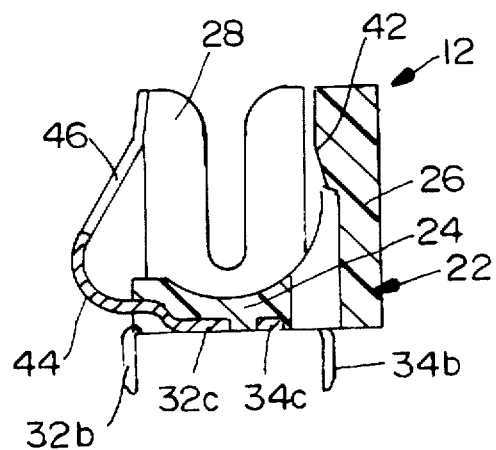
FIG. 9 is a vertical section taken generally along line 9—9 of FIG. 3.
Figure 10:
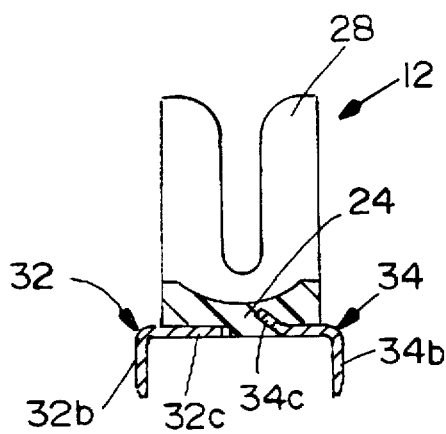
FIG. 10 is a vertical section taken generally along line 10—10 of FIG. 3.

More particularly, referring to FIG. 9 in conjunction with FIGS. 1, 6 and 7, receptacle means 40 is formed by upstanding side wall portion 26 of housing 22 to form one side of the receptacle means. In essence, the side wall of the housing forms a gripping arm for embracing one side of the motor. The gripping arm includes a plurality (three) of inwardly projecting gripping fingers 42 at the top of the side wall. With the motor casing being round, the central horizontal diameter of the motor will be below inwardly projecting gripping fingers 42 as seen best in FIG. 9.

The opposite side of receptacle means 40 is formed by integral portions of conductive contact 32. Specifically, the conductive contact, being fabricated of stamped and formed sheet metal material, has a spring arm 44 projecting upwardly from body portion 32c. The spring arm terminates in inwardly directed spring finger portions 46 for embracing the opposite side of motor 14 (i.e. the side opposite gripping fingers 42 of side wall 26 of the housing). Like the gripping fingers of the housing, spring finger portions 46 of spring arm 44 engage the motor above its horizontal center diameter so that the motor is held below both the gripping fingers 42 of the housing and the spring finger portions 46 of conductive contact 32.

By forming receptacle means 40 in part by the housing and in part by one of the conductive contacts, this combined plastic and metal receptacle provides a robust structure with a considerable springing gripping action which cannot be provided by total plastic, alone. In addition, since plastic portions of the housing are not used to embrace both opposite sides of the motor, the tendency of spreading the housing apart to a point of breaking is not even an issue. Therefore, the bottom or base wall 24 of the housing can be made considerably thinner and, thereby, reduce the height profile of the bracket. The bottom or base wall of the housing need only be sufficiently thick for insulatingly isolating contacts 32 and 34 and insert-molding the contacts therein.

Lastly, it should be understood that other contact means on the bracket housing can be used as part of the receptacle means for the motor or other electrical device. In the exemplary embodiment, conductive contacts 32 and 34 are used to engage the terminals of motor 14. However, it should be understood that other contact means, such as a grounding contact, can be used with portions thereof forming part of the receptacle means on the housing.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A bracket for mounting a generally cylindrical motor on a printed circuit board, the motor including a pair of terminals positioned on opposite sides of a longitudinal axis, the bracket comprising:

an elongated dielectric housing adapted to receive the motor and having a longitudinal axis which corresponds generally to the longitudinal axis of the motor;

a pair of conductive contacts mounted on the housing on opposite sides of the longitudinal axis, each contact including a contact portion adapted for engaging a respective one of the motor terminals and a tail portion adapted for connection to an appropriate circuit trace on the printed circuit board; and receptacle means adapted for holding the motor in position in the bracket such that the motor terminals are in engagement with the contact portions of the contacts, wherein the receptacle means is formed in part on one side of the longitudinal axis by a portion of the dielectric housing having a gripping arm for embracing one side of the motor, and in part on the other side of the longitudinal axis by a portion of at least one of the conductive contacts having a spring arm for embracing an opposite side of the motor.

2. The bracket of claim 1 wherein each of the pair of conductive contacts includes a body portion extending generally parallel to the longitudinal axis of the housing with said contact portion and said tail portion at opposite ends thereof.

3. The bracket of claim 2 wherein the spring arm projects from the body portion of at least one conductive contact intermediate its opposite ends.

4. The bracket of claim 1 wherein each of said contacts is a one-piece structure stamped and formed of sheet metal material.

5. The bracket of claim 1 wherein said dielectric housing includes a shroud portion adapted for protecting a rotating shaft end of the motor.

6. The bracket of claim 1 wherein said conductive contacts are mounted on the housing by means of at least the body portions of the contacts being insert molded within a base portion of the housing.

* * * * *